United States Patent
Han et al.

(10) Patent No.: US 11,769,827 B2
(45) Date of Patent: Sep. 26, 2023

(54) POWER TRANSISTOR WITH SOFT RECOVERY BODY DIODE

(71) Applicant: Wolfspeed, Inc., Durham, NC (US)

(72) Inventors: Kijeong Han, Apex, NC (US);
Sei-Hyung Ryu, Cary, NC (US);
Daniel Jenner Lichtenwalner, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 182 days.

(21) Appl. No.: 17/110,027

(22) Filed: Dec. 2, 2020

(65) Prior Publication Data

US 2022/0173237 A1 Jun. 2, 2022

(51) Int. Cl.
| | |
|---|---|
| H01L 29/78 | (2006.01) |
| H01L 29/16 | (2006.01) |
| H01L 29/66 | (2006.01) |
| H01L 27/02 | (2006.01) |

(52) U.S. Cl.
CPC ...... *H01L 29/7804* (2013.01); *H01L 27/0255* (2013.01); *H01L 29/1608* (2013.01); *H01L 29/66712* (2013.01)

(58) Field of Classification Search
CPC ............. H01L 29/7804; H01L 27/0255; H01L 29/1608; H01L 29/66712; H01L 29/66068; H01L 29/32; H01L 29/0878; H01L 29/1095; H01L 29/7802
See application file for complete search history.

(56) References Cited

U.S. PATENT DOCUMENTS

| | | |
|---|---|---|
| 2004/0195618 A1 | 10/2004 | Saito et al. |
| 2007/0048982 A1 | 3/2007 | Nemoto et al. |
| 2009/0057711 A1 | 3/2009 | Chen |
| 2015/0014764 A1 | 1/2015 | Tamura et al. |
| 2015/0311325 A1 | 10/2015 | Zhang |

(Continued)

FOREIGN PATENT DOCUMENTS

DE 102007019551 A1 10/2008

OTHER PUBLICATIONS

Cheng, et al., "Fast Reverse Recovery Body Diode in High-Voltage VDMOSFET Using Cell-Distributed Schottky Contacts," IEEE Transactions on Electron Devices, vol. 50, Issue 5, May 2003, pp. 1422-1425.

(Continued)

*Primary Examiner* — Mohammed R Alam
(74) *Attorney, Agent, or Firm* — Myers Bigel, P.A.

(57) ABSTRACT

A transistor includes a substrate, a drift layer on the substrate, and a junction implant in the drift layer opposite the substrate. The junction implant includes a body well and a source well within the body well. A source contact is in electrical contact with the source well and the body well. A drain contact is in electrical contact with the substrate. A gate insulator is on the drift layer and over a portion of the body well and the source well. A gate contact is on the gate insulator. A softness of a body diode between the source contact and the drain contact is greater than 0.5. By providing the transistor such that the softness factor of the body diode is greater than 0.5, the switching performance of the body diode and thus switching losses of the transistor when used in a bidirectional conduction application will be significantly reduced.

26 Claims, 7 Drawing Sheets

(56) References Cited

U.S. PATENT DOCUMENTS

| | | | |
|---|---|---|---|
| 2016/0035881 A1 | 2/2016 | Tamura et al. | |
| 2016/0307993 A1* | 10/2016 | Kuribayashi | H01L 29/47 |
| 2017/0213908 A1* | 7/2017 | Fursin | H01L 29/407 |
| 2018/0233564 A1* | 8/2018 | Kumada | H01L 29/36 |
| 2022/0109049 A1 | 4/2022 | Miyazato | |

OTHER PUBLICATIONS

Lai, et al., "Characteristics and Utilization of a New Class of Low On-Resistance MOS-Gated Power Device," IEEE Industry Applications Conference, Oct. 3-7, 1999, pp. 1073-1079.

Saito, et al., "Semisuperjunction MOSFETTs: New Design Concept for Lower On-Resistance and Softer Reverse-Recovery Body Diode," IEEE Transactions on Electron Devices, vol. 50, Issue 8, Aug. 2003, pp. 1801-1806.

Schmitt, et al., "A Comparison of Electron, Proton and Helium Ion Irradiation for the Optimization of the CoolMOS Body Diode," International Symposium on Power Semiconductor Devices, Santa Fe, New Mexico, Jun. 2002, pp. 229-232.

Invitation to Pay Additional Fees and Partial Search for International Patent Application No. PCT/US2021/060286, dated Feb. 16, 2022, 20 pages.

Baliga, Jayant, "Fundamental of Power Semiconductor Devices," 2nd Edition, Springer, 1114 pages.

Cova, et al., "Power p—i—n diodes for snubberless application: H+ irradiation for soft and reliable reverse recovery," Microelectronics Reliability, vol. 43, 2003, pp. 81-87.

Hayashi, et al., "Temperature and injection level dependencies and impact of thermal oxidation on carrier lifetimes in p-type and ntype 4H—SIC epilayers," Journal of Applied Physics, vol. 109, 2011, 5 pages.

Hazdra, et al., "Local lifetime control by light ion irradiation: impact on blocking capability of power P—i—N diode," Microelectronics Journal, vol. 32, 2001, pp. 449-456.

Kimoto, et al., "Impacts of recombination at the surface and in the substrate on carrier lifetimes of n-type 4H—SiC epilayers," Journal of Applied Physics, vol. 108, 2010, 7 pages.

Leveque, et al., "Identification of hydrogen related defects in proton implanted float-zone silicon," European Physical Journal: Applied Physics, vol. 23, 2003, pp. 5-9.

Rahimo, et al., "Freewheeling Diode Reverse Recovery Failure Modes in IGBT Applications," IEEE Transactions on Industry Applications, vol. 37, 2001, 10 pages.

Ryu, et al., "Impact of Carrier Lifetime Enhancement Using High Temperature Oxidation on 15kV 4H-SiC P-GTO Thyristor," Materials Science Forum, vol. 897, pp. 587-590.

International Search Report and Written Opinion for International Patent Application No. PCT/US2021/060286, dated May 19, 2022, 32 pages.

* cited by examiner

POWER TRANSISTOR WITH SOFT RECOVERY BODY DIODE

FIELD OF THE DISCLOSURE

The present disclosure relates to transistors, and in particular to power transistors including a body diode having soft recovery characteristics and methods for manufacturing the same.

BACKGROUND

Transistors have numerous applications in modern electronics. Power transistors, which are transistors that are capable of handling high voltages and currents, are often used in switching circuitry for delivering power to a load. Transistors used in power switching circuitry generally need to be capable of conducting current bidirectionally. Accordingly, an anti-parallel diode is provided in conjunction with a transistor in power switching circuitry. In the case of a metal-oxide-semiconductor field-effect transistor (MOSFET), an anode of the anti-parallel diode is coupled to a drain of the MOSFET and a cathode of the anti-parallel diode is coupled to a source of the MOSFET. This allows current to flow from the drain to the source in the MOSFET during a forward conduction mode of operation and from the source to the drain via the anti-parallel diode in a reverse conduction mode of operation. When switching between conducting and blocking in the anti-parallel diode, performance characteristics of the anti-parallel diode will determine the speed at which such a transition can occur and the switching losses that occur. It is generally desirable to minimize both the transition time between modes of operation and the switching losses. Accordingly, there is a present need for an anti-parallel diode for use in conjunction with a transistor to improve switching speeds and reduce switching losses.

SUMMARY

In one embodiment, a transistor includes a substrate, a drift layer on the substrate, and a junction implant in the drift layer opposite the substrate. The junction implant includes a body well and a source well within the body well. A source contact is in electrical contact with the source well and the body well. A drain contact is in electrical contact with the substrate. An insulating layer is on the drift layer and over a portion of the body well and the source well. A gate contact is on the insulating layer. A softness factor of a body diode between the source contact and the drain contact is greater than 0.5. By providing the transistor such that the softness factor of the body diode is greater than 0.5, the switching performance of the body diode and thus switching losses of the transistor when used in a bidirectional conduction application will be significantly reduced.

In one embodiment, a transistor includes a substrate, a drift layer on the substrate, and a junction implant in the drift layer opposite the substrate. The junction implant includes a body well and a source well within the body well. A source contact is in electrical contact with the source well and the body well. A drain contact is in electrical contact with the substrate. An insulating layer is on the drift layer and over a portion of the body well and the source well. A gate contact is on the insulating layer. A body diode is formed by the body well, the drift layer, and the substrate between the source contact and the drain contact. During a forward bias mode of operation of the body diode, a concentration of minority carriers at an interface between the body well and the drift layer is less than a concentration of minority carriers at an interface between the drift layer and the substrate. By designing the transistor to provide the aforementioned minority carrier profile in the drift layer of the body diode, the snappiness of the body diode will be significantly reduced, thereby improving the switching performance of the transistor when used in a bidirectional conduction application.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
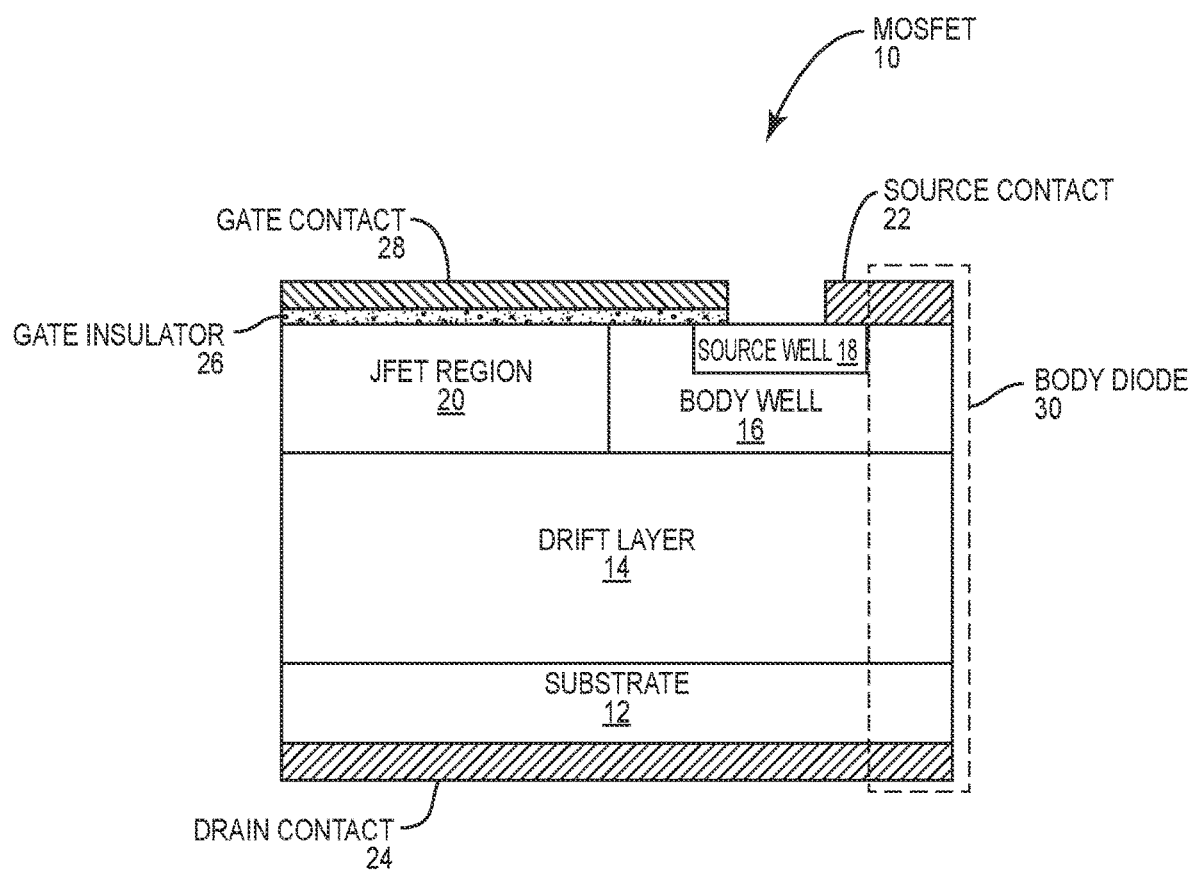
FIG. 1 illustrates a cross-sectional view of a transistor according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a cross-sectional view of a transistor 10 according to one embodiment of the present disclosure. The transistor 10 includes a substrate 12 and a drift layer 14 on the substrate 12. A body well 16 is provided in a surface of the drift layer 14 opposite the substrate 12. A source well 18 is provided in the body well 16 such that the source well 18 is within the body well 16. A junction field-effect transistor (JFET) region 20 is also provided in the surface of the drift layer 14 opposite the substrate 12, adjacent to the body well 16. A source contact 22 is provided on the drift layer 14 opposite the substrate 12 such that the source contact 22 is in electrical contact with the source well 18 and the body well 16. A drain contact 24 is provided on the substrate 12 such that it is in electrical contact with the substrate 12. A gate insulator 26 is provided on the surface of the drift layer 14 opposite the substrate 12 such that the gate insulator 26 is over the JFET region 20, a portion of the body well 16, and a portion of the source well 18. A gate contact 28 is on the gate insulator 26.

In one embodiment, the transistor 10 is an n-type device wherein the substrate 12, the drift layer 14, the source well 18, and the JFET region 20 are n-type, while the body well 16 is p-type. A doping concentration of the substrate 12 may be between $1 \times 10^{18}$ cm$^{-3}$ and $1 \times 10^{21}$ cm$^{-3}$. A thickness of the substrate 12 may be between 10 µm and 360 µm. A doping concentration of the drift layer 14 may be between $1 \times 10^{17}$ cm$^{-3}$ and $5 \times 10^{13}$ cm$^{-3}$. The doping concentration of the drift layer 14 may be continuous along the thickness thereof (from top to bottom as shown in FIG. 1), or may vary according to a doping profile that changes along the thickness thereof. A thickness of the drift layer 14 may be between 2 µm and 200 µm. The doping concentration of the drift layer 14 may be dependent on the thickness of the drift layer 14. In particular, the doping concentration may be inversely proportional to the thickness of the drift layer 14. The body well 16 may have a doping concentration between $1 \times 10^{16}$ cm$^{-3}$ and $3 \times 10^{19}$ cm$^{-3}$. The body well 16 may have a thickness between 0.2 µm and 4 µm. The source well 18 may have a doping concentration between $1 \times 10^{18}$ cm$^{-3}$ and $1 \times 10^{21}$ cm$^{-3}$. The source well 18 may have a thickness between 0.1 µm and 2 µm. The JFET region 20 may have a doping concentration between $1 \times 10^{16}$ cm$^{-3}$ and $2 \times 10^{17}$ cm$^{-3}$. The JFET region 20 may have a thickness between 0.2 µm and 4 µm. While the transistor 10 is discussed above as an n-type device, the principles of the present disclosure apply equally to p-type devices. In one embodiment, the transistor 10 is a silicon carbide (SiC) device. However, the principles of the present disclosure apply equally to any material systems. For any of the doping concentration ranges or thickness ranges above, the present disclosure contemplates the use of any discrete point within the range or any sub-range within the broader range. For example, the present disclosure contemplates that the doping concentration of the drift layer 14 may be between $1 \times 10^{17}$ cm$^{-3}$ and $5 \times 10^{13}$ cm$^{-3}$, at or near $1 \times 10^{17}$ cm$^{-3}$, at or near $5 \times 10^{13}$ cm$^{-3}$, between $1 \times 10^{16}$ cm$^{-3}$ and $5 \times 10^{13}$ cm$^{-3}$, between $1 \times 10^{17}$ cm$^{-3}$ and $1 \times 10^{15}$ cm$^{-3}$, or any other discrete point or sub-range within the broader exemplary range. The same applies to all ranges of doping concentrations and thickness ranges given herein.

In one embodiment, the transistor is a metal-oxide-semiconductor field-effect transistor (MOSFET). In such an embodiment, the gate insulator 26 may be an oxide layer. In another embodiment, the transistor is a metal-insulator-semiconductor field-effect transistor (MISFET).

The transistor 10 may be a power device capable of blocking high voltages and conducting high currents. In particular, the transistor 10 may have a breakdown voltage between 350V and 20 kV, depending on the application. Along this spectrum of breakdown voltages, an on-state resistance of the transistor 10 may be between 0.3 mΩ·cm$^2$ and 100 mΩ·cm$^2$. That is, for a breakdown voltage of 350V, the on-state resistance of the transistor 10 may be less than 0.3 mΩ·cm$^2$, while for a breakdown voltage of 20 kV, the on-state resistance of the transistor 10 may be less than 100 mΩ·cm$^2$. Other examples include an on-state resistance less than 90 mΩ·cm$^2$ for a breakdown voltage of 15 kV, an on-state resistance less than 70 mΩ·cm$^2$ for a breakdown voltage of 10 kV, and an on-state resistance less than 10 mΩ·cm$^2$ for a breakdown voltage of 3.3 kV. The on-state resistance may vary between these minimum and maximum values according to the breakdown voltage thereof.

As discussed above, transistors used for power switching applications should conduct current bidirectionally. While this may be achieved with an external diode coupled in anti-parallel between the source contact 22 and the drain contact 24 (anode to source, cathode to drain), the same result can also be achieved using a built-in body diode formed in the structure of the transistor 10. As shown in FIG. 1, a body diode 30 is formed between the source contact 22 and the drain contact 24 at the right of the device. The body diode 30 is a PiN diode including the source contact 22 as the anode, the body well 16, the drift layer 14, the substrate 12, and the drain contact 24 as the cathode. Using the body diode 30 to allow bidirectional current conduction saves space by foregoing the need for an external diode. However, the body diode 30 may not be optimized for switching. In particular, the body diode 30 may suffer from a high degree of snappiness, which, as discussed in detail below, may increase switching times and switching losses.

Figure 2:
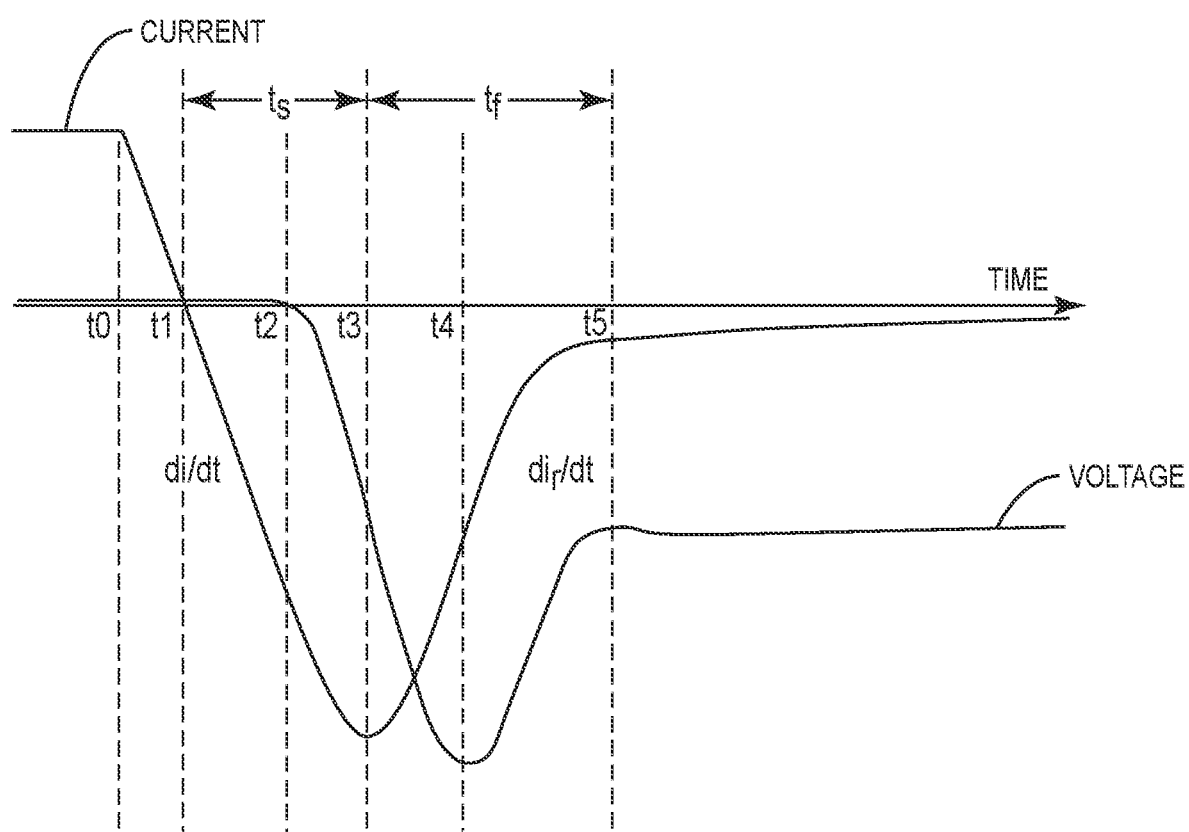
FIG. 2 is a graph illustrating the reverse recovery of a body diode in a transistor according to one embodiment of the present disclosure.

The snappiness of a diode characterizes the reverse recovery thereof. To illustrate, FIG. 2 is a graph showing a forward current and voltage across a diode when switching from forward conduction to reverse bias or blocking. Before time t0, the diode is forward biased and thus conducting current from anode to cathode. The voltage across the diode is thus around zero. During forward bias, excess minority carriers are injected into the drift region of a diode such that the drift region contains excess minority carriers. At time t0, the diode is switched from forward to reverse bias by changing the voltage supplied at the anode and cathode thereof. The current through the diode thus begins to decrease as excess minority carriers decay. Because of the current flow from the excess minority carriers, the voltage across the diode remains the same. At time t1, the current through the diode switches from a positive current to a negative current. The voltage across the diode continues to remain the same. As the stored excess minority carriers in the drift region begin to decrease, a resistance of the region increases. Accordingly, at time t2 the voltage across the diode begins to decrease, while the current continues to decrease. The depletion region begins to form at this time. At time t3, the reverse current through the diode reaches its maximum value when very few excess minority carriers are left in the drift region. At time t4, the negative voltage across the diode reaches its peak value. The current through the diode and the voltage across it continue to increase until time t5 when they stabilize at zero and the reverse voltage, respectively.

The time between when the current through the diode passes through zero (t1) and reaches its negative peak value (t3) is shown as $t_s$. The time between when the current through the diode reaches its negative peak value (t3) and when it recovers to $0.2 \cdot I_{RRM}$ (t5) is shown as $t_f$. The ratio between $t_f$ and $t_s$ (tilts) is defined herein as a softness factor $S_1$ of the diode. The softness factor is inversely correlated with snappiness of the diode. Accordingly, a higher softness factor is desirable. A secondary softness factor $S_2$ is defined herein as $$\left| \frac{\left. \frac{di}{dt} \right|_{i=0}}{\left( \frac{di_r}{dt} \right)_{max}} \right|,$$

where a higher value of the secondary softness factor is desirable. Yet another way to quantify the snappiness of softness of a diode is by looking at the area between x-axis (zero current) and the negative reverse recovery current curve. It is generally desirable to minimize this area.

Conventionally, those skilled in the art will design a transistor based on several desired characteristics of the transistor itself, such as breakdown voltage and on-state resistance. Put another way, those skilled in the art have generally not designed transistors with the performance of the body diode in mind. The inventors of the present disclosure discovered that one or more characteristics of the body diode of a transistor can be improved significantly with small or minimal impacts on the performance of the transistor. In particular, the snappiness of the body diode in a transistor can be significantly reduced while maintaining the performance of the transistor.

To improve the snappiness of the body diode 30 within the transistor 10, several adjustments are made. First, the transistor 10 is designed such that the body diode 30 is a non-punch through diode. As discussed herein, a non-punch through diode is defined as a diode wherein at the breakdown voltage of the diode, the depletion region formed in the drift layer thereof does not penetrate into the substrate or neighboring n+ layer. In the case of the body diode 30, this means that at the breakdown voltage thereof, the depletion region will remain within the drift layer 14 and not penetrate into the substrate 12. The body diode 30 may be designed to be non-punch through by changing a doping concentration and/or a thickness of the drift layer 14 compared to conventional designs wherein these parameters are optimized for the desired breakdown voltage and on-state resistance of the transistor 10. In particular, the thickness and the doping concentration of the drift layer 14 may be increased compared to conventional designs in order to ensure that the depletion region of the body diode 30 remains within the drift layer 14 during reverse bias. Accordingly, for a given breakdown voltage of the transistor 10, the drift layer 14 will be thicker and more highly doped compared to its conventional counterparts.

To provide a non-punch through diode, the following equations may be used to determine a thickness and doping concentration of the drift layer 14. Equation (1) illustrates a relationship between breakdown voltage $BV_{diode}$ and doping concentration $N_D$. Equation (2) illustrates a relationship between a maximum width of a depletion region $W_{d,max}$ and the doping concentration $N_D$.

$$BV_{diode} = 3.0 \times 10^{15} N_D^{-3/4} \tag{1}$$

$$W_{d,max} = 1.82 \times 10^{11} N_D^{-7/8} \tag{2}$$

For a given breakdown voltage, the doping concentration of the drift layer 14 can thus be chosen along with a thickness of the drift layer 14 so that the maximum width of the depletion region W d,max does not exceed the thickness of the drift layer 14.

Applying conventional design rules to the transistor 10 would dictate choosing a thickness and doping concentration of the drift layer 14 in order to minimize on-state resistance for a given breakdown voltage. While this may lead to optimization of these characteristics, it results in the body diode 30 being a punch through diode. The inventors of the present disclosure discovered that the thickness and doping concentration of the drift layer 14 can be chosen such that the body diode 30 is a non-punch through diode while also maintaining desirable, but perhaps slightly higher, on-state resistance of the transistor 10 at a given breakdown voltage.

Figure 3:
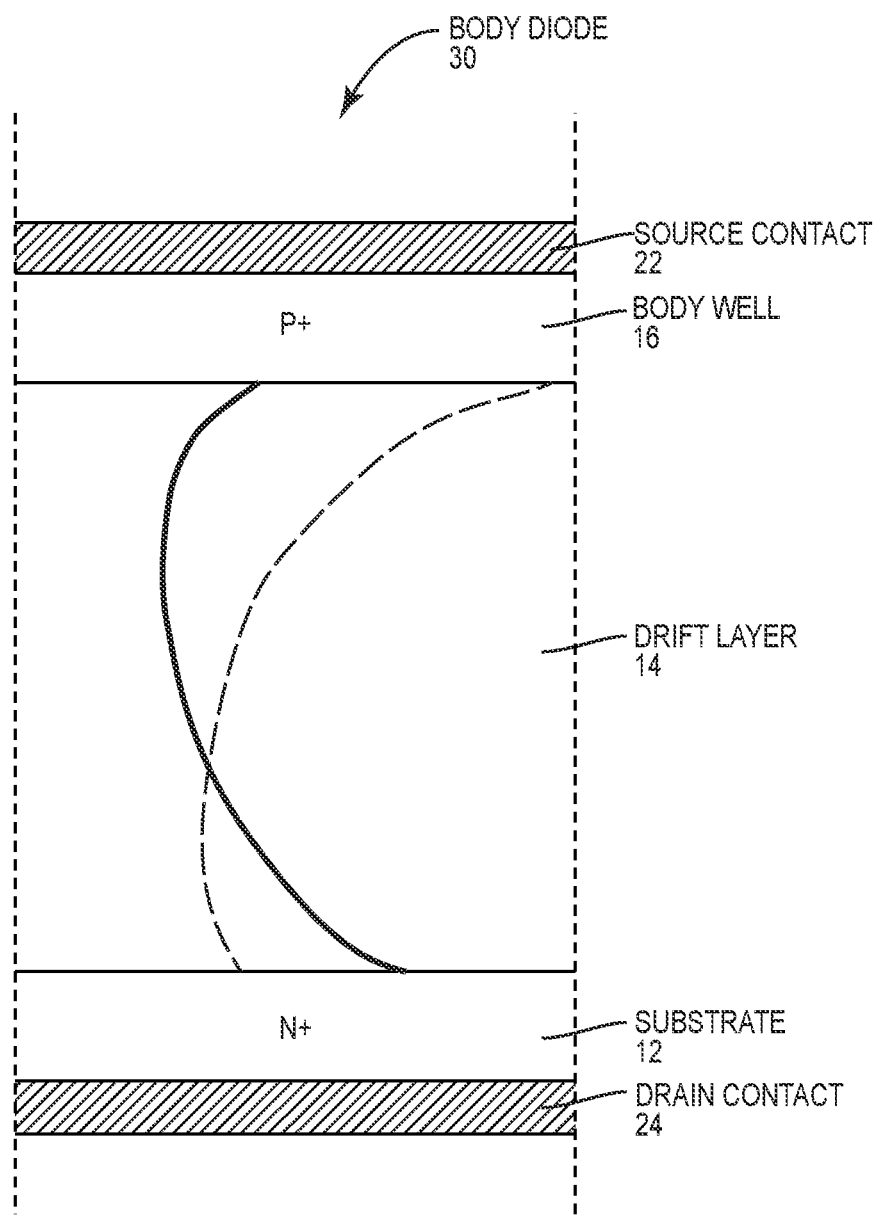
FIG. 3 is a cross-sectional view of a body diode of a transistor according to one embodiment of the present disclosure.

In addition to or independently from providing the body diode 30 as a non-punch through diode, a distribution profile of minority carriers within the body diode 30 during forward bias is also changed. FIG. 3 thus shows a cross-section of the body diode 30 isolated from the transistor 10. A dashed line shows a distribution of minority carriers during forward bias if the body diode 30 is provided in a conventional manner without the improvements discussed herein. A solid line shows a distribution of minority carriers during forward bias for the body diode 30 when the improvements discussed herein are provided. As shown, without the improvements discussed herein a concentration of minority carriers is higher at an interface between the body well 16 and the drift layer 14 than at an interface between the drift layer 14 and the substrate 12. This may cause reduced performance during reverse recovery of the diode. In particular, as the body diode 30 enters reverse bias, if there are a high concentration of minority carriers at the interface between the body well 16 and the drift layer 14, as illustrated by the dashed line, it will take longer to sweep out these minority carriers and begin forming the depletion region. This will prolong is as shown in FIG. 2, thereby increasing snappiness (decreasing the softness factor $t_f/t_s$) and degrading performance. Further, if there is a relatively low concentration of minority carriers at the interface between the drift layer 14 and the substrate 12, again as illustrated by the dashed line, as the depletion region grows these carriers may be swept out of the drift layer 14 thus causing the depletion region to punch through into the substrate 12. As discussed above, this will also degrade performance due to the sudden disappearance of the diffusion capacitance within the body diode 30. Further, increasing the concentration of minority carriers near the interface between the drift layer 14 and the substrate 12 prolongs $t_f$ as shown in FIG. 2, thereby decreasing snappiness (increasing the softness factor tilts). Accordingly, it is desirable to have a lower concentration of minority carriers at the interface between the body well 16 and the drift layer 14 and a higher concentration of minority carriers at the interface between the drift layer 14 and the substrate 12 as illustrated by the solid line. In general, it is desirable to have a positive slope (on average) of minority carrier concentration in the drift layer 14 between the body well 16 and the substrate 12.

There are several ways to achieve the desired minority carrier profile discussed above. In one embodiment, a carrier lifetime of the drift layer 14 is enhanced in order to increase the concentration of minority carriers at and near the interface between the drift layer 14 and the substrate 12. In SiC, carbon vacancies may decrease carrier lifetimes by forming recombination centers for minority carriers. To decrease the carbon vacancies, a high temperature oxidation of the drift layer 14 is performed as discussed in detail below, thereby increasing carrier lifetime throughout the drift layer 14. In various embodiments, the minority carrier lifetime in the drift layer 14 may be intentionally raised to be between 0.5 ρs and 20 ρs. Notably, the present disclosure contemplates the use of any discrete value within the exemplary range of minority carrier lifetimes given above, or any sub-range within the broader range. For example, in various embodiments, the minority carrier lifetime of the drift layer 14 may be between 10 μs and 20 μs, between 1 μs and 5 μs, between 5 μs and 10 μs, between 15 μs and 20 μs, between 3 μs and 10 μs, or any other sub-range or discrete point within the broader exemplary range.

In addition to improvements in carrier lifetime in the drift layer 14, a reduction in minority carriers at the interface between the body well 16 and the drift layer 14 is also desirable. This can be achieved by reducing a doping concentration of the body well 16 such that less minority carriers are injected from the body well 16 into the drift layer 14 during forward bias. In various embodiments, a doping concentration of the body well 16 near the interface between the body well 16 and the drift layer 14 is between $1 \times 10^{16}$ cm$^{-3}$ and $3 \times 10^{19}$ cm$^{-3}$, which may be anywhere from about five to fifteen times less than conventional doping concentrations. More specifically, a doping concentration of the body well 16 within 0.2 μm of the interface between the body well 16 and the drift layer 14 may be between $1 \times 10^{16}$ cm$^{-3}$ and $3 \times 10^{19}$ cm$^{-3}$. Notably, the present disclosure contemplates that the doping concentration of the body well 16 may be any discrete value within the given exemplary range of doping concentrations, or any sub-range within the exemplary range.

Figure 4:
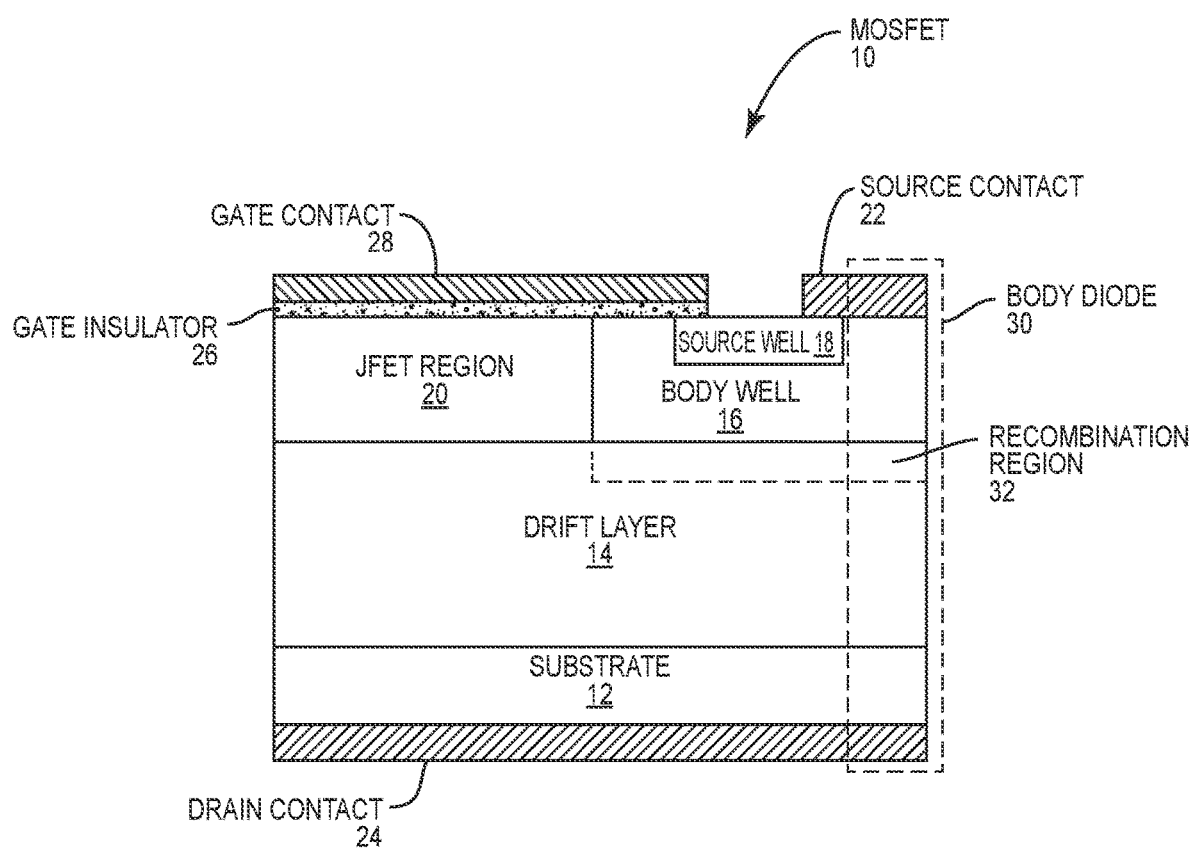
FIG. 4 is a cross-sectional view of a transistor according to one embodiment of the present disclosure.

In addition to or separately from reducing the doping concentration of the body well 16, a recombination region 32 may be provided in the drift region 14 at or near the interface between the body well 16 and the drift layer 14, as shown in FIG. 4. The recombination region 32 is a region including a higher density of minority carrier recombination centers than the surrounding drift layer 14. This may be accomplished by intentionally damaging the recombination region 32 via an implantation process, or by doping the recombination region 32. In one embodiment, the recombination region is implanted with argon in order to increase the density of minority carrier recombination centers therein. However, other implants such as hydrogen and helium may also be used in some embodiments. The density of minority carriers in the recombination region 32 may be between five to ten times greater than in the drift layer 14. In various embodiments, a density of minority carrier recombination centers in the recombination region 32 is between $1 \times 10^{13}$ cm$^{-3}$ and $1 \times 10^{18}$ cm$^{-3}$. While the recombination region 32 is shown as a localized region in the body diode 30 at or near the interface of the body well 16 and the drift layer 14, the recombination region 32 may be a blanket region over the entirety of the transistor 10, or may include several regions that are separated from one another. Notably, the present disclosure contemplates the use of any discrete value for the density of minority carrier recombination centers within the recombination region 32 within the given exemplary range, as well as any sub-range within the given exemplary range. For example, the density of minority carriers in the recombination region 32 may be between 6 and 7 times greater than the drift layer 14, between 7 and 8 times greater than the drift layer 14, between 8 and 9 times greater than the drift layer 14, between 5 and 9 times greater than the drift layer 14, between 6 and 9 times greater than the drift layer, or at any other sub-range or discrete point within the broader exemplary range.

Figure 5:
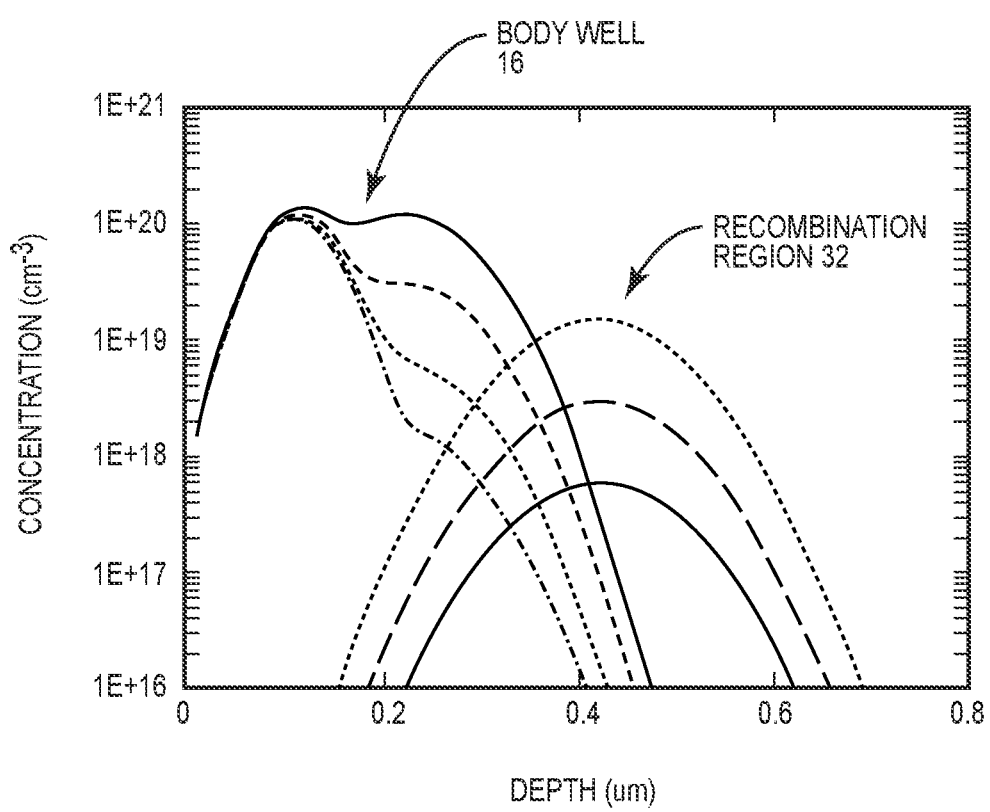
FIG. 5 is a graph illustrating doping profiles for a number of implants in a transistor according to one embodiment of the present disclosure.
Figure 6:
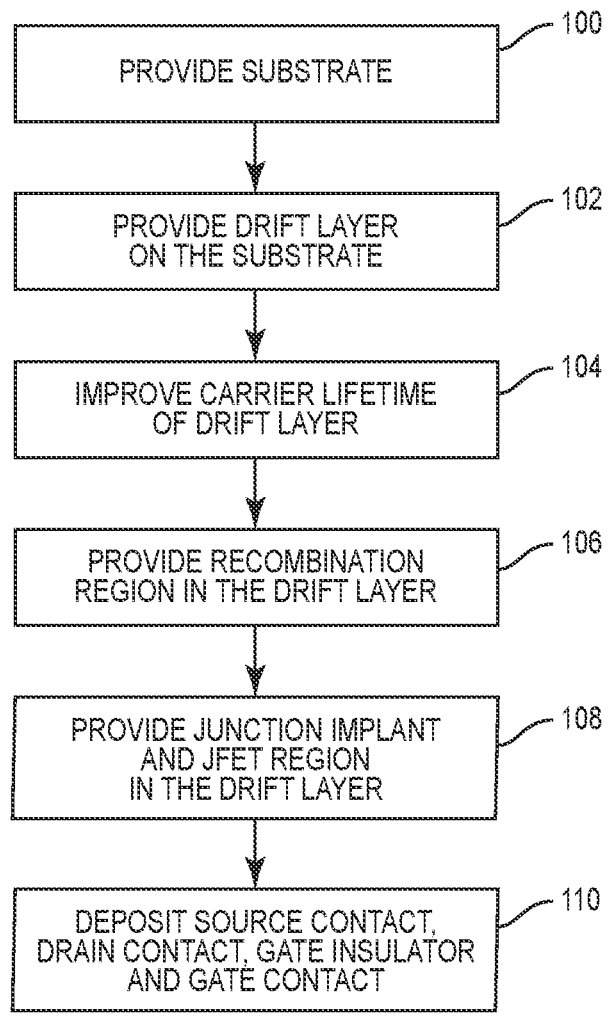
FIG. 6 is a flow diagram illustrating a method for manufacturing a transistor according to one embodiment of the present disclosure.

FIG. 5 is a graph illustrating potential implantation profiles for the body well 16 and the recombination region 32 according to various embodiments of the present disclosure. On the left side of the graph, four different doping profiles for the body well 16 are shown. A first solid line represents the conventional doping profile for the body well 16. As discussed above, this may result in an undesirably high level of minority carrier injection into the drift layer 14. Accordingly, the three lines below this first solid line, shown as a dashed line, a dotted line, and a dotted and dashed line, illustrate doping profiles for the body well 16 according to various embodiments of the present disclosure. As shown, each one of the doping profiles provides a peak at roughly the same level, but reduces the doping concentration near the bottom of the body well 16, which is where the interface between the body well 16 and the drift layer 14 is located. In the middle of the graph, three lines are shown illustrating various doping profiles for the recombination region 32. In particular, a solid line shows the recombination region 32 resulting from an implantation dose of argon at $1 \times 10^{13}$ cm$^{-3}$, a dashed line shows the recombination region 32 resulting from an implantation dose of argon at $5 \times 10^{13}$ cm$^{-3}$, and a dotted line shows the recombination region 32 resulting from an implantation does of argon at $2.5 \times 10^{14}$ cm$^{-3}$. As shown, the recombination region 32 may overlap with the body well 16, peaking at the interface between the body well 16 and the drift layer 14. Notably, the doping profiles for the body well 16 and the recombination region 32 shown in FIG. 6 are merely illustrative. Those skilled in the art will readily appreciate that there are myriad ways to provide the body well 16 and the recombination region 32 to accomplish the objectives discussed above, all of which are contemplated herein.

Providing the body diode 30 as a non-punch through diode and/or redistributing the minority carriers in the drift layer 14 as discussed above may enable the body diode 30 to provide a softness factor $S_1$ greater than 0.5. In various embodiments, the improvements to the body diode 30 discussed above, either alone or in combination, may enable the body diode 30 to provide a softness factor $S_1$ greater than 0.6, greater than 0.7, greater than 0.8, greater than 0.9, greater than 1.0, greater than 1.1, greater than 1.2, greater than 1.3, greater than 1.4, greater than 1.5, greater than 2.0, greater than 2.5, greater than 3.0, greater than 3.5, greater than 4.0, greater than 4.5, greater than 5.0, greater than 5.5, greater than 6.0, greater than 6.5, greater than 7.0, greater than 7.5, greater than 8.0, greater than 8.5, greater than 9.0, greater than 9.5, and up to 10. More generally, the present disclosure contemplates a softness factor $S_1$ of the body diode 30 at any discrete point between 0.5 and 10, or any subrange within 0.5 and 10.

Similarly, the improvements to the body diode 30 may provide a secondary softness $S_2$ factor greater than 0.5. In various embodiments, the improvements to the body diode 30 discussed above, either alone or in combination, may enable the body diode 30 to provide a secondary softness factor $S_2$ greater than 0.6, greater than 0.7, greater than 0.8, greater than 0.9, greater than 1.0, greater than 1.1, greater than 1.2, greater than 1.3, greater than 1.4, greater than 1.5, greater than 2.0, greater than 2.5, greater than 3.0, greater than 3.5, greater than 4.0, greater than 4.5, greater than 5.0, greater than 5.5, greater than 6.0, greater than 6.5, greater than 7.0, greater than 7.5, greater than 8.0, greater than 8.5, greater than 9.0, greater than 9.5, and up to 10. More generally, the present disclosure contemplates a secondary softness factor $S_2$ of the body diode 30 at any discrete point between 0.5 and 10, or any subrange within 0.5 and 10.

FIG. 6 is a flow diagram illustrating a method for manufacturing a transistor according to one embodiment of the present disclosure. First, a substrate is provided (step 100). A drift layer is provided on the substrate (step 102). As discussed above, a thickness and doping concentration of the drift layer is selected in order to make a body diode in the finished transistor a non-punch through diode. In particular, a thickness of the drift layer and/or doping concentration of the drift layer are increased compared to conventional designs for a given breakdown voltage in order to provide the body diode as a non-punch through diode. A carrier lifetime improvement process is performed on the drift layer (step 104). In one embodiment, the carrier lifetime improvement process is a high temperature oxidation of the drift layer. In particular, the drift layer may be oxidized at a temperature between 1300° C. and 1500° C. for a period of time between 30 minutes and 5 hours in order to decrease carbon vacancies that may otherwise reduce minority carrier lifetime in the drift layer. Notably, the present disclosure is not limited to any particular carrier lifetime improvement process, but rather contemplates any currently existing methods for improving carrier lifetime.

A recombination region is provided in the drift layer (step 106). In one embodiment, providing the recombination region comprises damaging a region of the drift layer via ion implantation. In another embodiment, providing the recombination region comprises implanting argon into a region of the drift layer. The recombination region may be provided as a blanket region or localized to certain regions within the drift layer. In general, the recombination region is provided so that it is localized to a particular depth in the drift layer in order to provide increased recombination centers near an interface between a body well and the drift layer. A junction implant including a body well and a source well is provided in the surface of the drift layer opposite the substrate (step 108). Notably, the body well is provided with a doping concentration near the interface between the body well and the drift layer that is less than conventional design processes dictate. The source well is provided within the body well at a surface of the drift layer. Both the source well and the body well may be provided via ion implantation processes. A JFET region may also be provided in some embodiments. The JFET region is an area of increased carrier concentration adjacent to the body well, and may also be provided by an ion implantation process.

Finally, a source contact, a drain contact, a gate oxide, and a gate contact are provided (step 110). The source contact is provided on the surface of the drift layer opposite the substrate and in electrical contact with the source well and the body well. The drain contact is provided on the surface of the substrate opposite the drift layer and is in electrical contact with the substrate. The gate oxide is provided on the surface of the drift layer opposite the substrate over the JFET region, a portion of the body well, and a portion of the source well. The gate contact is provided on the gate oxide.

Figure 7:
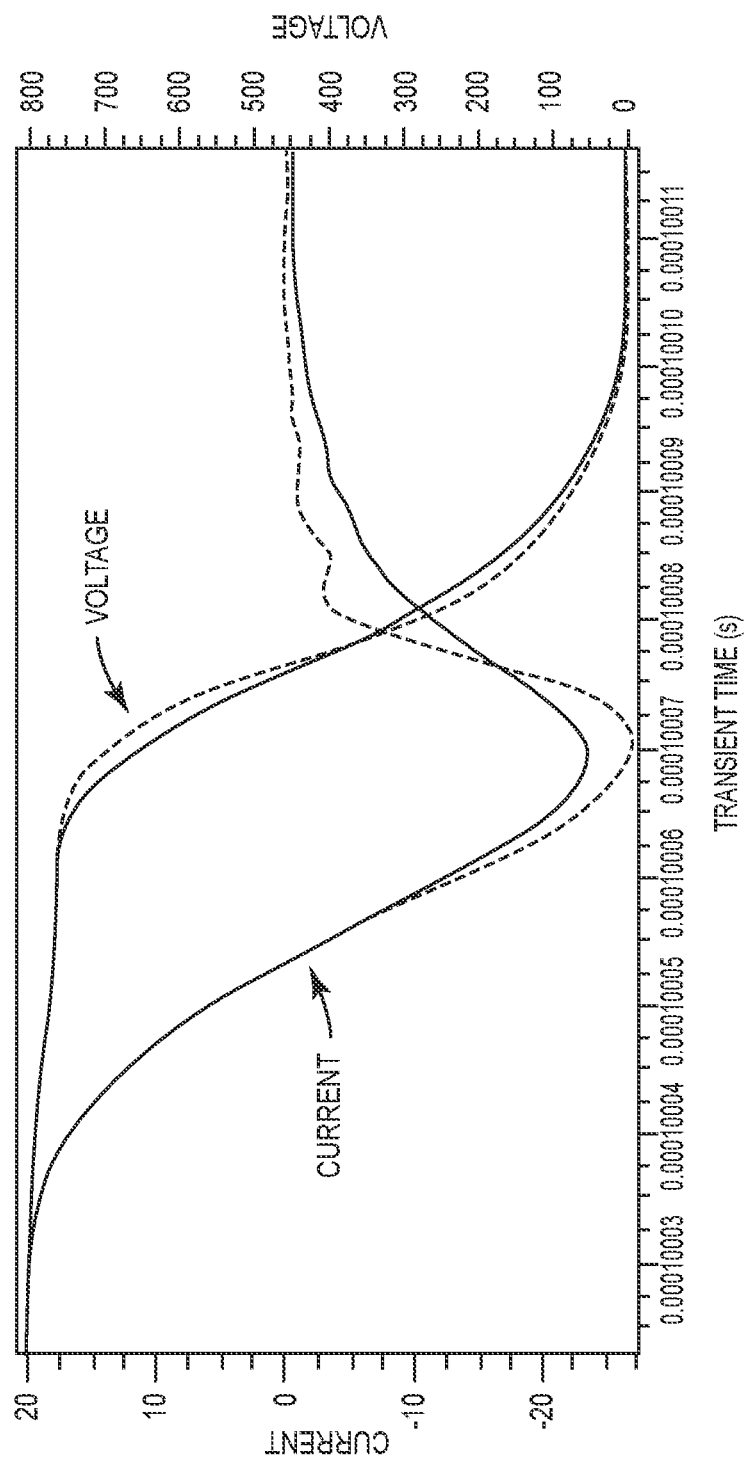
FIG. 7 is a graph illustrating the performance of a body diode of a transistor according to one embodiment of the present disclosure.

FIG. 7 is a graph comparing the reverse recovery of a conventional body diode within a transistor to a body diode including the improvements discussed herein to decrease snappiness. In particular, a solid line illustrates the current through and voltage across (each labeled on the graph) a body diode including the improvements discussed herein, while a dashed line illustrates the current through and voltage across a body diode in a conventional transistor. As shown, the improved body diode takes less time to reach its maximum reverse recovery current and the maximum reverse recovery current is significantly less than for the conventional body diode. The improved body diode also shows an extended time between the maximum reverse recovery current and 0.2 times the maximum reverse recovery time compared to the conventional body diode, and the slope of the current as it increases between these values is shallower than for the conventional diode. The current through the improved body diode also exhibits significantly less ringing than the conventional body diode. All of the above shows that the softness factor $S_1$ of the improved body diode ($t_s/t_f$ as discussed above) will be significantly improved in the improved body diode. Further, the secondary softness $S_2$ factor is also improved due to the relationship between the slope reverse recovery current, and the total area between the x-axis and the reverse recovery current curve is reduced. In short, the improved body diode is significantly less snappy than a conventional body diode. As discussed above, reduced snappiness means that the improved body diode can switch faster and with less switching losses compared to a conventional body diode.

Those skilled in the art will recognize improvements and modifications to the preferred embodiments of the present disclosure. All such improvements and modifications are considered within the scope of the concepts disclosed herein and the claims that follow.

What is claimed is:

1. A transistor comprising:
a substrate having a first doping type and a first doping concentration;
a drift layer on the substrate, the drift layer having the first doping type and a second doping concentration;
a junction implant in the drift layer opposite the substrate, the junction implant comprising:
a body well having a second doping type opposite the first doping type and a third doping concentration; and
a source well having the first doping type, wherein the source well is within the body well;
a source contact in electrical contact with the source well and the body well;
a drain contact in electrical contact with the substrate;
a gate insulator on the drift layer and over a portion of the body well and the source well;
a body diode between the source contact and the drain contact; and
a gate contact on the gate insulator,
wherein the second and third doping concentrations and a thickness of the drift layer are configured so that a softness factor of the body diode is greater than 0.5.

2. The transistor of claim 1 wherein the second and third doping concentrations and the thickness of the drift layer are configured so that the softness factor of the body diode is less than or equal to 10.

3. The transistor of claim 1 wherein the substrate is a silicon carbide substrate and the drift layer is a silicon carbide drift layer.

4. The transistor of claim 3 wherein the body diode is a non-punch through diode.

5. The transistor of claim 4 further comprising a recombination region below the body well, wherein the recombination region comprises a higher concentration of recombination centers than the drift layer.

6. A transistor comprising:
a silicon carbide substrate having a first doping type and a first doping concentration;
a silicon carbide drift layer on the silicon carbide substrate, the drift layer having the first doping type and a second doping concentration;
a junction implant in the drift layer opposite the silicon carbide substrate, the junction implant comprising:
a body well having a second doping type opposite the first doping type; and
a source well having the first doping type, wherein the source well is within the body well;
a source contact in electrical contact with the source well and the body well;
a drain contact in electrical contact with the silicon carbide substrate;
a gate insulator on the drift layer and over a portion of the body well and the source well;
a gate contact on the gate insulator; and
a recombination region below the body well,
wherein a softness factor of a body diode between the source contact and the drain contact is greater than 0.5,
wherein the body diode is a non-punch through diode,
wherein the recombination region has a first concentration of recombination centers and the drift layer has a second concentration of recombination centers, and
wherein the first concentration of recombination centers is between 5 and 10 times greater than a the second concentration of recombination centers.

7. The transistor of claim 6 wherein the body diode is configured to have a first concentration of minority carriers at an interface between the body well and the silicon carbide drift layer that is less than a second concentration of minority carriers at an interface between the silicon carbide drift layer and the substrate during forward bias operation.

8. The transistor of claim 3 wherein during a forward bias mode of operation of the body diode, the body diode is configured so that a concentration of minority carriers at an interface between the body well and the drift layer is less than a concentration of minority carriers at an interface between the drift layer and the substrate.

9. The transistor of claim 1 wherein:
a breakdown voltage of the transistor is between 350V and 20 kV; and
an on-state resistance of the transistor is between 0.3 mΩ·cm2 and 100 Ω·cm2.

10. A transistor comprising:
a substrate having a first doping type and a first doping concentration;
a drift layer on the substrate, the drift layer having the first doping type and a second doping concentration;
a junction implant in the drift layer opposite the substrate, the junction implant comprising:
a body well having a second doping type opposite the first doping type; and
a source well having the first doping type, wherein the source well is within the body well;
a source contact in electrical contact with the source well and the body well;
a drain contact in electrical contact with the substrate;
a gate insulator on the drift layer and over a portion of the body well and the source well;
a gate contact on the gate insulator; and
a body diode between the source contact and the drain contact,
wherein the body diode is configured to have a first concentration of minority carriers at an interface between the body well and the drift layer that is less than a second concentration of minority carriers at an interface between the drift layer and the substrate during forward bias operation.

11. The transistor of claim 10 wherein the body diode is a non-punch through diode.

12. The transistor of claim 11 wherein the substrate is a silicon carbide substrate and the drift layer is a silicon carbide drift layer.

13. The transistor of claim 12 wherein:
a breakdown voltage of the transistor is between 350V and 20 kV; and
an on-state resistance of the transistor is between 0.3 mΩ·cm2 and 100 Ω·cm2.

14. A method for manufacturing a transistor comprising:
providing a substrate having a first doping type and a first doping concentration;
providing a drift layer on the substrate, the drift layer having the first doping type and a second doping concentration;
providing a junction implant in the drift layer opposite the substrate, the junction implant comprising:
providing a body well having a second doping type opposite the first doping type and a third doping concentration;

providing a source well having the first doping type, wherein the source well is within the body well;

depositing a source contact in electrical contact with the source well and the body well;

depositing a drain contact in electrical contact with the substrate;

providing a gate insulator on the drift layer and over a portion of the body well and the source well;

depositing a gate contact on the gate insulator; and providing a body diode between the source contact and the drain contact, wherein a thickness of the drift layer and the second and third doping concentrations are configured so that a depletion region formed in the body diode when the body diode is biased at a breakdown voltage of the body diode does not extend into the substrate.

15. The method of claim 14 wherein the second and third doping concentrations and the thickness of the drift layer are configured so that a softness factor of the body diode is greater than 0.5 and less than 10.

16. The method of claim 14 wherein providing the drift layer on the substrate comprises providing the drift layer such that the body diode is a non-punch through diode.

17. The method of claim 14 further comprising providing a recombination region below the body well, wherein the recombination region comprises a higher concentration of minority carrier traps than drift layer.

18. The method of claim 17 wherein providing the recombination region comprises performing ion implantation in the recombination region.

19. The method of claim 18 wherein providing the recombination region comprises performing ion implantation with argon.

20. The method of claim 14 further comprising performing a high temperature oxidation of the drift layer to increase a carrier lifetime of minority carriers therein.

21. The method of claim 20 wherein the body well is configured so that during a forward bias mode of operation of the body diode, a concentration of minority carriers at an interface between the body well and the drift layer is less than a concentration of minority carriers at an interface between the drift layer and the substrate.

22. The method of claim 14 wherein:
a breakdown voltage of the transistor is between 350V and 20 kV; and
an on-state resistance of the transistor is between 0.3 mΩ·cm2 and 100 Ω·cm2.

23. A transistor comprising:
a substrate having a first doping type and a first doping concentration;
a drift layer on the substrate, the drift layer having the first doping type and a second doping concentration;
a junction implant in the drift layer opposite the substrate, the junction implant comprising:
a body well having a second doping type opposite the first doping type; and
a source well having the first doping type, wherein the source well is within the body well;
a source contact in electrical contact with the source well and the body well;
a drain contact in electrical contact with the substrate;
a gate insulator on the drift layer and over a portion of the body well and the source well; and
a body diode between the source contact and the drain contact; and
a gate contact on the gate insulator,
wherein the body diode is a non-punch through diode.

24. The transistor of claim 23 wherein the substrate is a silicon carbide substrate and the drift layer is a silicon carbide drift layer.

25. The transistor of claim 1 wherein the body diode is configured so that the drift layer has a minority carrier lifetime of between 0.5 microseconds and 20 microseconds during forward bias operation.

26. The transistor of claim 10 wherein the body diode is configured so that the drift layer has a minority carrier lifetime of between 0.5 microseconds and 20 microseconds during forward bias operation.

* * * * *

UNITED STATES PATENT AND TRADEMARK OFFICE
CERTIFICATE OF CORRECTION

PATENT NO. : 11,769,827 B2
APPLICATION NO. : 17/110027
DATED : September 26, 2023
INVENTOR(S) : Han et al.

It is certified that error appears in the above-identified patent and that said Letters Patent is hereby corrected as shown below:

In the Specification

Column 5, Line 48: Please correct "$t_f$ and is (tilts)" to read --$t_f$ and $t_s$ ($t_f/t_s$)--

Column 6, Line 47: Please correct "W d,max" to read --$W_{d,max}$--

Column 7, Line 14: Please correct "prolong is" to read --prolong $t_s$--

Column 7, Line 27: Please correct "tilts" to read --$t_f/t_s$--

Column 7, Lines 47-48: Please correct "0.5 ρs and 20 ρs" to read --0.5 μs and 20 μs--

In the Claims

Column 12, Line 2, Claim 6: Please correct "than a the second" to read --than the second--

Signed and Sealed this
Twelfth Day of December, 2023

Katherine Kelly Vidal
*Director of the United States Patent and Trademark Office*